(12) United States Patent
Park

(10) Patent No.: US 7,746,258 B2
(45) Date of Patent: Jun. 29, 2010

(54) DIGITAL-ANALOG CONVERTER AND CAMERA MODULE HAVING THE SAME

(75) Inventor: Cheong Yong Park, Ansan-si (KR)

(73) Assignee: LG Innotek Co., Ltd., Seoul (KR)

( * ) Notice: Subject to any disclaimer, the term of this patent is extended or adjusted under 35 U.S.C. 154(b) by 0 days.

(21) Appl. No.: 11/997,698

(22) PCT Filed: Aug. 14, 2007

(86) PCT No.: PCT/KR2007/003897

§ 371 (c)(1),
(2), (4) Date: Feb. 1, 2008

(87) PCT Pub. No.: WO2008/020704

PCT Pub. Date: Feb. 21, 2008

(65) Prior Publication Data

US 2009/0140902 A1    Jun. 4, 2009

(30) Foreign Application Priority Data

Aug. 16, 2006   (KR)   .................. 10-2006-0077234

(51) Int. Cl.
*H03M 1/66* (2006.01)
(52) U.S. Cl. ...................... 341/144; 341/145
(58) Field of Classification Search ............. 341/144, 341/145; 382/233; 375/240.01, 233, 240.24, 375/240.26, 340
See application file for complete search history.

(56) References Cited

U.S. PATENT DOCUMENTS

| 6,154,162 | A | 11/2000 | Watson et al. | |
|---|---|---|---|---|
| 6,329,941 | B1* | 12/2001 | Farooqi | 341/145 |
| 6,344,812 | B1 | 2/2002 | Takeda et al. | |
| 6,518,899 | B2 | 2/2003 | Yu | |
| 2004/0032520 | A1* | 2/2004 | Andersson | 348/308 |
| 2005/0078404 | A1* | 4/2005 | Kuramoto et al. | 360/75 |
| 2006/0125670 | A1* | 6/2006 | Cho et al. | 341/144 |
| 2006/0209612 | A1* | 9/2006 | Kajigaya | 365/222 |
| 2007/0258651 | A1* | 11/2007 | Shin et al. | 382/232 |
| 2009/0040243 | A1* | 2/2009 | Hisada et al. | 345/690 |

FOREIGN PATENT DOCUMENTS

JP    6-112825    4/1994
KR    10-2004-0099887 A    12/2004

* cited by examiner

*Primary Examiner*—Jean B Jeanglaude
*Assistant Examiner*—Joseph Lauture
(74) *Attorney, Agent, or Firm*—Saliwanchik, Lloyd & Saliwanchik

(57) ABSTRACT

Disclosed are a digital-analog converter and a camera module having the same. The digital-analog converter includes a plurality of decoders for receiving bits of a digital input signal by dividing the bits in a predetermined bit unit except for lower bits of the digital input signal, and decoding the bits into thermometer code signals, a delay unit for delaying output of the lower bits of the digital input signal, a latch unit for synchronizing output signals of the decoders with an output signal of the delay unit, and a current source for converting a digital signal output from the latch unit into an analog signal.

20 Claims, 1 Drawing Sheet

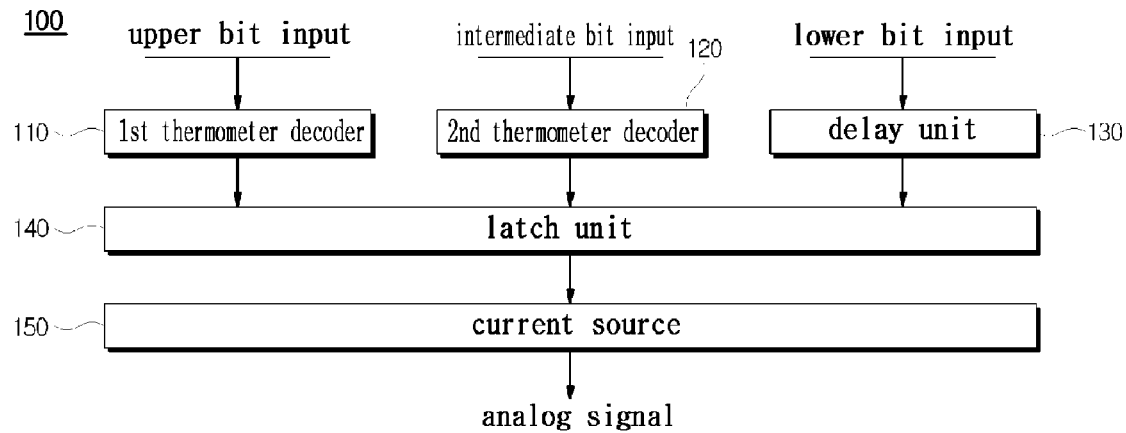
[Fig. 1]
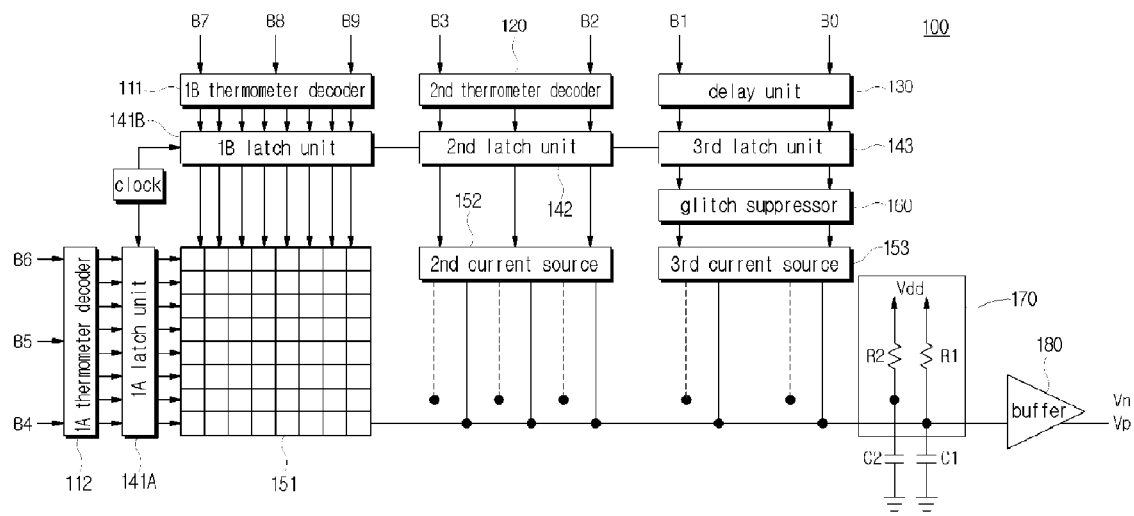
[Fig. 2]
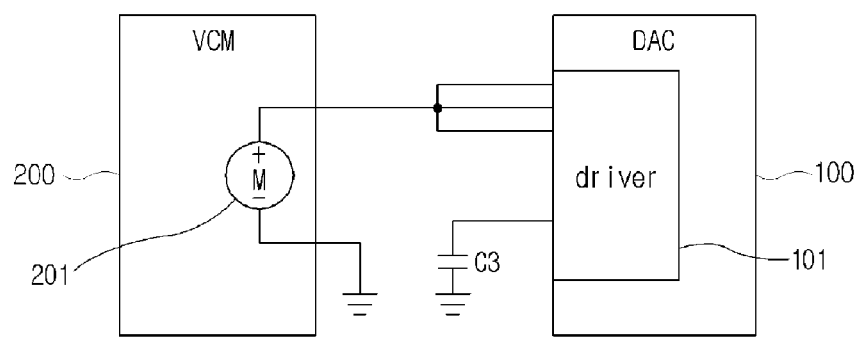
[Fig. 3]

DIGITAL-ANALOG CONVERTER AND CAMERA MODULE HAVING THE SAME

CROSS-REFERENCE TO RELATED APPLICATION

This application is the U.S. national stage application of International Patent Application No. PCT/KR2007/003897, filed Aug. 14, 2007, the disclosure of which is hereby incorporated by reference in its entirety.

TECHNICAL FIELD

The embodiment relates to a digital-analog converter and a camera module having the same.

BACKGROUND ART

A digital-analog converter (DAC) is a device to change a digital signal into an analog signal. The DAC has been used in a wireless communication system, a voice and image signal processing device, and measurement equipment.

In addition, the DAC can control a motor by converting a digital signal into an analog signal. For example, the DAC may be used for a driver to drive a voice coil motor (VCM) constituting a camera module of a portable terminal.

The VCM of the camera module reciprocates within a relatively short distance. The reciprocation of the VCM changes the position of a lens, thereby providing an automatic focusing (AF) function for an object.

In order to drive the VCM used for the implementation of such an AF function, three factors of linearity, hysteresis, and sensitivity are important. Among this, the linearity is the most important factor.

The linearity is determined by the digital-analog converter. If the linearity of the DAC is degraded, the precise operation of the VCM is difficult, and the accuracy of the AF function of the camera module cannot be ensured.

DISCLOSURE

Technical Problem

The embodiment provides a digital-analog converter using a plurality of thermometer decoders and a camera module having the digital-analog converter.

The embodiment provides a digital-analog converter and a camera module having the same, capable of improving the linearity of a voice coil motor (VCM) by using a plurality of thermometer decoders and a delay unit.

Technical Solution

An embodiment provides a digital-analog converter comprising a plurality of decoders for receiving bits of a digital input signal by dividing the bits in a predetermined bit unit except for lower bits of the digital input signal, and decoding the bits into thermometer code signals; a delay unit for delaying output of the lower bits of the digital input signal; a latch unit for synchronizing output signals of the decoders with an output signal of the delay unit, and a current source for converting a digital signal output from the latch unit into an analog signal.

An embodiment provides a camera module comprising a digital-analog converter comprising a plurality of decoders for receiving bits of a digital input signal by dividing the bits in a predetermined bit unit except for lower bits of the digital input signal, and decoding the bits into thermometer code signals; a delay unit for delaying and outputting the lower bits of the digital input signal; a latch unit for synchronizing output signals of the decoders with an output signal of the delay unit, and a current source for converting a digital signal output from the latch unit into an analog signal, and a motor driven by an analog signal output from the digital-analog converter.

ADVANTAGEOUS EFFECTS

A digital-analog converter according to the embodiment embodies a plurality of thermometer decoders, thereby improving the linearity of an analog signal.

In addition, a motor is linearly controlled in a camera module including a digital-analog converter, thereby improving an automatic focusing function.

DESCRIPTION OF DRAWINGS

FIG. 1 is a block diagram showing a digital-analog converter according to the embodiment;

FIG. 2 is a block diagram showing a 10-bit digital-analog converter according to the embodiment; and FIG. 3 is a block diagram showing a camera module including a digital-analog converter according to the embodiment.

BEST MODE

Hereinafter, the embodiment will be described with reference to accompanying drawings.

FIG. 1 is a block diagram showing a digital-analog converter 100 according to the embodiment.

Referring to FIG. 1, the digital-analog converter 100 includes a plurality of thermometer decoders 110 and 120, a delay unit 130, a latch unit 140, and a current source 150. Binary digital signals input to the digital-analog converter 100 are divided into at least three groups of bits and input to the thermometer decoders 110 and 120 and the delay unit 130.

The thermometer decoders 110 and 120 can be realized by using a first thermometer decoder 110 and a second thermometer decoder 120. The first thermometer decoder 110 receives upper bits extracted from a binary digital input signal and converts the upper bits into thermometer codes. The second thermometer decoder 120 receives intermediate bits into thermometer codes. The embodiment is not limited to two thermometer decoders, and a plurality of thermometer decoders may be embodied in order to increase the bit number and improve the linearity of digital input signals.

In this case, the first and second thermometer decoders 110 and 120 receive the digital input signal by dividing most significant bits (MSB) into upper bits and intermediate bits. The first and second thermometer decoders 110 and 120 output $2^N$ codes (N denotes the number of input bits) according to the number of digital input bits by using logical gates (AND, NAND, OR, NOR, and INVERTER).

Since the thermometer decoders 110 and 120 have the same current source represented by 1 LSB, and the output of the thermometer decoders 110 and 120 increases step by step, a scheme of employing the thermometer decoders 110 and 120 have a superior matching characteristic as compared with that of another scheme (e.g., a scheme of employing a binary weighted current source). In addition, the thermometer decoders 110 and 120 can reduce the errors of integral non-linearity (INL) and differential non-linearity (DNL), which are static characteristics, and minimize glitch. The first thermometer decoder 110 and the second thermometer decode 120 may have the same input bit number, or different input bit numbers. For example, the ratio of the upper bits to the lower bits may be set as 4:1, 3:1, 1:1, X:(X−1), X:(X+1), in which the X is a natural number exceeding 1.

In addition, the delay unit 130 receives lower bits extracted from the digital input signal, delays the output of the lower bits by the throughput time of the first thermometer decoder 110, or the second thermometer decoder 120, and outputs the lower bits.

A digital signal input to the delay unit 130 corresponds to least significant bits, and is delayed by a predetermined time interval in order to achieve the synchronization with the conversion time of the upper bits or the conversion time the lower bits.

In this case, the ratio of the upper bits, the intermediate bits, and the lower bits may be set as 3:1:1, 2:2:1, X:(X−1):X−1, X:X+1:X, X:(X−1):X, or X:X/2:X+1 (X is a natural number exceeding 1). For example, when 10 bits are input, the upper bits, the intermediate bits, and the lower bits may be realized as the ratio of 6:2:2, 4:4:2, 4:4:3, 3:4:4, 4:3:4, or 4:2:4.

The latch unit 140 outputs thermometer codes, which has been converted from the upper bits of the input signal, and binary digital codes of the lower bits, which have passed through the delay unit 130, to the current source 150 in synchronization with a predetermined driving clock. In this case, a plurality of latch units may be realized in a bit group unit.

The current source 150 converts the thermometer codes and the binary digital codes output from the latch unit 140 into current to be output, thereby converting input digital codes into an analog signal. In addition, the output terminal of the current source 150 may include a voltage converter (see, reference number 170 of FIG. 2). The voltage converter (see, reference number 170 of FIG. 1) may convert the current into a voltage level to be output. In this case, a plurality of current sources may be realized in a bit block unit.

The current source 150 may output a differential analog signal, and the error of the INL between the MSBs and the LSBs of the analog signal may be minimized, thereby improving the linearity of the analog signal.

FIG. 2 is a block diagram showing a 10-bit digital-analog converter 100A according to the embodiment. Hereinafter, the 10-bit digital-analog converter 100A will be described in detail with reference to FIGS. 1 and 2.

Referring to FIG. 2, the 10-bit digital-analog converter 100A includes a 1A thermometer decoder 111 and a 1B thermometer decoder 112, which constitute a first thermometer decoder, a second thermometer decoder 120, a delay unit 130, a 1A latch unit 141A and a 1B latch unit 141B, which constitute a latch unit, a second latch unit 142, a third latch unit 143, a first current source 151, a second current source 152, a third current source 153, and a glitch suppression unit 160.

In a 10-bit digital input signal, three of six upper bits B4 to B9 are input to the 1A thermometer decoder 111 and the 1B thermometer decoder 112, respectively, two intermediate bits B2 and B3 are input to the second thermometer decoder 120, and two lower bits B0 and B1 are input to the delay unit 130. Although the ratio of the number MSBs to the number of LSBs of the digital input signal is set as 8:2 in the present embodiment, the ratio of the number of the MSBs and the number of LSBs may be set as one of 4:1, 7:3, and 3:2. However, the present embodiment is not limited thereto. In addition, the sum of the upper bits and the intermediate bits may be several times the number of the lower bits.

The 1A thermometer decoder 111 and the 1B thermometer decoder 112 are arranged in the form of a matrix. The 1A thermometer decoder 111 receives three lower bits B4, B5, and B6 among six upper bits, converts the three lower bits B4, B5, and B6 into eight thermometer codes corresponding to column components of the matrix, and outputs the eight thermometer codes. The 1B thermometer decoder receives three upper bits B7, B8, and B9 among the six upper bits and converts the three upper bits B7, B8, and b9 into eight thermometer codes corresponding to row components of the matrix.

The 1A latch unit 141A receives the thermometer codes converted in the 1A thermometer decoder 111, and the 1B latch unit 141B receives thermometer codes converted in the 1B thermometer decoder 112.

Accordingly, 64 bit thermometer codes are output through the 1A latch unit 141A and the 1B latch unit 141B. In other words, the digital input signal having six bits is converted into 63 thermometer codes. In this case, since one of the 64 signal levels, which can be represented by a digital code having six bits, is zero, only 63 thermometer codes are necessary, one redundant thermometer code represents a dummy code. When the 6 upper bits of the digital signal are converted into thermometer codes, a glitch can be reduced, and monotonous increase can be improved.

The first current source 151 receives the output of the 1A latch unit 141A and the 1B latch unit 141B to output an analog current signal. In this case, differential current switches are driven in each cell, thereby outputting digital codes having the 6 upper bits as differential signals having 128-step. Such a first current source 151 has a current source matrix structure, and includes 63 current sources to supply the same current and 63 differential current source switches (e.g., complementary metal oxide semiconductor; CMOS) to perform an on/off switching operation according to 63 thermometer codes. The second thermometer decoder 120 receives intermediate bits of the digital input signal. In detail, the second thermometer decoder 120 receives two intermediate bits and converts the two intermediate bits into four thermometer codes to output the four thermometer codes into the second latch unit 142. In this case, one redundant thermometer code serves as a dummy code.

The second latch unit 142 outputs the thermometer codes corresponding to the two intermediate bits in synchronization with the 1A latch unit 141A and the 1B latch unit 141 according to a driving clock.

The second current source 152 may be realized by using three current sources and three differential current source switches. The differential current source switches are driven by the thermometer codes output from the second latch unit 142, thereby displaying the two intermediate bits as four-step current.

The delay unit 130 receives two lower bits, and delays the output of the two lower bits for a time interval of the decoding of the first thermometer decoders 111 and 112 or/and the second thermometer decoder 120. The third latch unit 143 performs synchronization of the two lower bits according to the driving clock.

In this case, the 1A latch unit 141A and the 1B latch unit 141B, the second latch unit 142, and the third latch unit 143 output the thermometer codes to the current sources 151, 152, and 153 in synchronization with the driving clock.

The glitch suppressor 160 removes glitch noise of a signal generated from the third latch unit 143. Such a glitch suppressor 160 is provided at the output terminal of the 1A and 1B latch units 141A and 141B or/and the second latch unit 142, thereby removing the glitch noise.

Here, an asynchronous phenomenon of signals occurs due to rapid variation of the digital input signal, or delay of the signal conversion in the digital-analog converter 100A, so that glitch energy is suddenly generated. Since such glitch energy increases the error of the linearity (e.g., the errors of the INL and the DNL) and noise to decrease a signal-to-noise ratio (SNR), the digital-analog converter has to be designed such that the glitch is suppressed as much as possible. Such a glitch suppressor 160 is designed such that a switch-on operation for current is delayed, and a switch-off operation is performed without delay time. Accordingly, the glitch suppressor 160 outputs a signal without the glitch.

The third current source 153 is a binary weighted current source, and may be realized by using two current sources and two differential current source switches. The differential current source switches are driven by the thermometer codes output from the second latch unit 143, thereby displaying digital codes having the two lower bit into four-step current.

The first to third current sources 151, 152, and 153 outputs 1023-step (e.g., 1 LSB/2 LSB/ . . . /10 LSB) differential current signals from a current source corresponding to the least significant bit.

In addition, the voltage converter 170 is connected to differential signal lines output from the first to third current sources 151, 152, and 153 to convert the differential current signals into voltage levels. Such a voltage converter 170 may be realized by using a supply voltage source Vdd and resistors R1 and R2 connected to the differential signal lines. In this case, the voltage converter 170 may be not included in the digital-analog converter 100A. In other words, the final outputs of the digital-analog converter 100A may be current signals Ip and In, or voltage signals Vp and Vn.

The differential current signal lines are connected to grounded condensers C1 and C2, thereby removing noise components of a signal.

The final terminal of the digital-analog converter 100A is connected to a buffer 180 to output the voltage converted by the voltage converter 170. The buffer 180 may output a current signal, or a voltage signal, and may be removed.

The digital-analog converter 100A may decode eight bit MSBs through a scheme of employing plurality of thermometer decoders, thereby reducing the errors of the INL and DNL, which are linearity errors. For example, the linearity between the MSB and LSB bits is improved, so that the INL has an error tolerance in the range of ±1.0 LSB, and the DNL has an error tolerance in the range of ±0.5 LSB.

FIG. 3 is a schematic view showing a camera module 200 including the digital-analog converter according to the embodiment.

Referring to FIG. 3, an actuator 201 of the camera module 200 is driven by receiving control voltage from the digital-analog converter 100. Accordingly, an automatic focusing function of the camera module 200 is improved. In detail, the digital-analog converter 100 converts a digital input signal into an output analog voltage signal to control a driver 101, thereby exactly open-loop controlling the operation of the voice coil motor 101 by using the analog voltage having improved linearity, and diving a lens to perform an AF function. Accordingly, the reliability for an AF function of the camera module 200 can be ensured.

In this case, the camera module 200 can be equipped with a portable phone, a PDA, a digital camera.

Accordingly, in the present embodiment, the linearity of the voice coil motor is improved among the linearity, the hysteresis, and the sensitivity of the voice coil motor, thereby driving a lens of a camera module step by step to exactly obtain a clear image.

While the invention has been shown and described with reference to certain preferred embodiments thereof, it will be understood by those skilled in the art that various changes in form and details may be made therein without departing from the spirit and scope of the invention as defined by the appended claims.

INDUSTRIAL APPLICABILITY

In a digital-analog converter and a camera module having the same according to the embodiment, a plurality of thermometer decoders are used, thereby improving the linearity of an analog signal.

Further, in a camera module including the digital-analog converter according to the embodiment, a motor is linearly controller, thereby improving an AF function.

The invention claimed is:

1. A digital-analog converter comprising:
   a plurality of thermometer decoders including a first thermometer decoder for converting upper bits of a digital input signal into thermometer code signals except for the lower bits of the digital input signal, and a second thermometer decoder for converting intermediate bits into thermometer code signals except for the upper bits and the lower bits of the digital input signal;
   a delay unit for delaying output of the lower bits of the digital input signal;
   a plurality of latch units including a first latch unit for synchronizing the thermometer code signals of the first thermometer decoder, a second latch unit for synchronizing the thermometer code signals of the second thermometer decoder, and a third latch unit for synchronizing the thermometer code signals of the thermometer decoders with an output code signal of the delay unit;
   a plurality of current sources including a first current source for converting the thermometer code signals outputted from the first latch unit into an analog signal, a second current source for converting the thermometer code signals outputted from the second latch unit into an analog signal, and a third current source for converting the output code signals outputted from the third latch unit into an analog signal; and
   a voltage converter to convert the analog signal outputted from the first to third current sources into a voltage level,
   wherein at least one of the first thermometer decoder and the second thermometer decoder includes a row thermometer decoder and a column thermometer decoder.

2. The digital-analog converter as claimed in claim 1, wherein the first thermometer decoder includes the row thermometer decoder and the column thermometer decoder to decode input bits by dividing the upper bits by a half.

3. The digital-analog converter as claimed in claim 2, wherein the first latch unit includes a fourth latch unit to receive thermometer code signal of the row thermometer decoder; and a fifth latch unit to receive the thermometer code signals of the column thermometer decoder.

4. The digital-analog converter as claimed in claim 3, wherein the first current source outputs a different analog signal having (2 upper bits)-step and has a current source matrix structure.

5. The digital-analog converter as claimed in claim 1, wherein a number of upper bits is larger than a number of the lower bits or the intermediate bits.

6. The digital-analog converter as claimed in claim 1, wherein the first thermometer decoder and the second thermometer decoder receive the bits, which are divided by a same bit number.

7. The digital-analog converter as claimed in claim 1, wherein the first thermometer decoder and the second thermometer decoder receive the bits, which are divided by a different bit numbers.

8. The digital-analog converter as claimed in claim 1, wherein the digital input signal comprises at least 10 bits.

9. The digital-analog converter as claimed in claim 1, wherein a ratio of the bits, which are input into the decoders and the delay unit, is one of 4:1, 7:3, and 3:2.

10. The digital-analog converter as claimed in claim 1, wherein a ratio (X:Y:Z) of the upper bits, the intermediate bits, and the lower bits is one of 3:1:1, 2:2:1, X:(X−1):(X−1), X:(X+1):X, X:(X−1):X, and X:(X/2):X.

11. The digital-analog converter as claimed in claim 1, wherein one of a number of the upper bits and a number of the intermediate bits is equal to a number of the lower bits.

12. The digital-analog converter as claimed in claim 1, wherein the first to third latch units synchronize the digital code signals of the thermometer decoders and the delay unit with a predetermined clock.

13. The digital-analog converter as claimed in claim 1, further comprising a buffer to perform a buffering operation with respect to a signal output from the first to third current sources.

14. The digital-analog converter as claimed in claim 1, comprising a glitch suppressor to remove glitch noise of the code signals outputted from the latch unit.

15. The digital-analog converter as claimed in claim 1, wherein at least one of the thermometer code signals outputted from the thermometer decoders is a dummy code.

16. The digital-analog converter as claimed in claim 1, wherein at least one of the first current source and the third current source outputs a differential analog signal.

17. The digital-analog converter as claimed in claim 16, wherein the first to third current sources is outputted from the differential analog signal of the third current source corresponding to the lower bits.

18. A camera module comprising:
a digital-analog converter; and
a motor driven by an analog signal output from the digital-analog converter,
wherein the digital-analog converter comprises:
a plurality of thermometer decoders including a first thermometer decoder for converting upper bits of a digital input signal into thermometer code signals except for the lower bits of the digital input signal, and a second thermometer decoder for converting intermediate bits into thermometer code signals except for the upper bits and the lower bits of the digital input signal;
a delay unit for delaying output of the lower bits of the digital input signal;
a plurality of latch units including a first latch unit for synchronizing the thermometer code signals of the first thermometer decoder, a second latch unit for synchronizing the thermometer code signals of the second thermometer decoder, and a third latch unit for synchronizing the thermometer code signals of the thermometer decoders with an output code signals of the delay unit;
a plurality of current sources including a first current source for converting the thermometer code signals outputted from the first latch unit into an analog signal, a second current source for converting the thermometer code signals outputted from the second latch unit into an analog signal, and a third current source for converting the output code signals outputted from the third latch unit into an analog signal; and
a voltage converter to convert the analog signal outputted from the first to third current sources into a voltage level, wherein at least one of the first thermometer decoder and the second thermometer decoder includes a row thermometer decoder and a column thermometer decoder.

19. The camera module as claimed in claim 18, wherein the motor comprises a voice coil motor (VCM).

20. The digital-analog converter as claimed in claim 18, wherein at least one of the first thermometer decoder and the second thermometer decoder includes a row thermometer decoder and a column thermometer decoder;
and wherein the first latch unit includes a fourth latch unit to receive an input bit of the row thermometer decoder, and a fifth latch unit to receive an input bit of the column thermometer decoder.

* * * * *